United States Patent [19]

Ta

[11] Patent Number: 5,308,742
[45] Date of Patent: May 3, 1994

[54] METHOD OF ETCHING ANTI-REFLECTION COATING

[75] Inventor: Thuy B. Ta, Austin, Tex.

[73] Assignee: AT&T Bell Laboratories, Murray Hill, N.J.

[21] Appl. No.: 893,178

[22] Filed: Jun. 3, 1992

[51] Int. Cl.$^5$ ................................. G03C 5/00
[52] U.S. Cl. ................................. 430/313; 430/314; 430/317; 430/323; 156/643; 156/646; 156/653; 156/654; 156/657
[58] Field of Search ............... 430/313, 314, 319, 323; 156/643, 646, 653, 654, 657

[56] References Cited

U.S. PATENT DOCUMENTS

| | | | |
|---|---|---|---|
| 4,312,732 | 1/1982 | Degenkolb et al. | 204/192 |
| 4,698,128 | 10/1987 | Berglund et al. | 156/643 |
| 4,910,122 | 3/1990 | Arnold et al. | 430/313 |

OTHER PUBLICATIONS

*American Chemical Society* 25, "Characterization and Processing of Polyimide Thin Films for Microelectronics Application," by J. H. Lai et al, pp. 38–40.
*Journal of Vacuum Science and Technology* A8, "$CF_4O_2$, Plasma Etching and Surface Modification of Polyimide Films: Time-dependent Surface Fluorination and Fluorination Model," by Scott et al., May/Jun. 1990, pp. 2382–2387.
*Journal of the Electrochemical Society*, 130, "Dry Etching of Polyimide in $O_2$-$CF_4$ and $O_2$-$SF_6$ Plasmas," by Gurban et al., 1983, pp. 2231–2236.
*Journal of Vacuum Science and Technology* A9(3), "Polyimide Etching in Ar, $O_2$, and $O_2/F_2$ Gas Mixtures: Effect of Ion Energy," by Tepermeister, et al., May/Jun. 1991, pp. 790–795.
*Plasma Chemistry and Plasma Processing*, vol. 6, No. 4, by Kogoma et al., Mar. 10, 1986, pp. 349–380.
Patent Application, "Integrated Circuit Fabrication Process Using a Bilayer Resist," by Messrs. Cuthbert, Fu, Olasupo Ser. No. 07/708,956, filed May 31, 1991, pp. 1–9.

*Primary Examiner*—John Kight, III
*Assistant Examiner*—Duc Truong
*Attorney, Agent, or Firm*—Richard D. Laumann

[57] ABSTRACT

A polyimide layer used in manufacturing semiconductor integrated circuits is etched in a plasma comprising $O_2$, Ar, and $CHF_3$. The plasma produces excellent critical dimension control and yields good resist to polyimide etching selectivity.

6 Claims, 1 Drawing Sheet

METHOD OF ETCHING ANTI-REFLECTION COATING

TECHNICAL FIELD

This invention relates to a method of integrated circuit manufacture which includes a step of etching organic materials that are useful as anti-reflection coatings in lithographic processes such as those used in deep ultraviolet lithography.

BACKGROUND OF THE INVENTION

As the dimensions of lithographically defined features become smaller, effects that were not significant at larger dimensions become important. For example, feature sizes may have identical size variations, and the variations may be acceptable for large features but unacceptable for small features because the variation is too high a percentage of the small feature size. Thus, critical dimension control is important for small feature size. Variations in dimensions may, of course, arise from many sources.

Integrated circuit features are typically defined with a lithographic pattern delineation process. A photosensitive material, commonly termed a *resist*, is formed on the substrate surface and portions of the resist are selectively exposed to radiation which creates a differential removal rate between the exposed and unexposed portions. The portions of the resist with the more rapid removal rate are now removed by, e.g., etching, to expose selected portions of the underlying substrate surface. Further processing, such as etching of the exposed substrate or ion implantation, etc., is now performed.

Ideally, all of the incident radiation travels a vertical path through the resist and is completely absorbed before reaching the bottom of the resist. This is, however, not always true in practice. Radiation may travel entirely through the resist and be reflected back into the resist. The reflection may be non-specular or from a non-horizontal surface, and the reflected radiation may be absorbed in portions of the resist that are not desirably exposed to radiation. The reflected radiation, of course, degrades the quality of the pattern delineation process because it is absorbed where it should not be absorbed.

To reduce the amount of reflected radiation, materials termed *anti-reflection* coatings have been developed. These materials are positioned underneath the resist. They are frequently organic polymers such as polyimides. Of course, polyimides are used for other purposes, such as interlevel dielectrics, in integrated circuit fabrication. For use as an interlevel dielectric, the polyimide frequently has to be patterned to form vias which expose portions of the underlying material. Of course, portions of the anti-reflection coating must also be patterned to expose the underlying substrate material. The use of polyimides in integrated circuits is discussed by Lai et al. in *Industrial Engineering Chemical Product Research Development*, 25, 1986, pp. 38–40. Consideration of the above shows that there must be an etching process for the polyimide.

Plasma etching of polyimides is discussed by Scott et al. in *Journal of Vacuum Science and Technology*, A8, May/June 1990, pp. 2382–2387. Scott used a mixture of $CF_4$ and $O_2$ and found that the addition of $CF_4$ increased the etch rate of the polyimide as compared to the rate obtained with only $O_2$. The increased etch rate was attributed to both etching by the $CF_4$ and the formation of atomic O in the plasma by the $CF_4$. Turban et al., *Journal of the Electrochemical Society*, 130, November 1983, pp. 2231–2236, also reported the etching of polyimide using $O_2$ and either $CF_4$ or $SF_6$. Tepermeister et al., *Journal of Vacuum Science and Technology*, A9, May/June 1991, pp. 790–795, reported the etching of polyimides using Ar, $O_2$ and $O_2/F_2$ plasmas. They reported that the etching process was a combination of gas phase plasma chemistry and plasma surface interactions. See also, Kogoma et al., *Plasma Chemistry and Plasma Processing*, 6, 1986, pp. 349–380, for a discussion of etching mechanisms of polyimide in $O_2/SF_6$ plasmas.

Of course, methods for detecting the endpoint of plasma etching processes are also known. See, for example, U.S. Pat. No. 4,312,732, issued on Jan. 26, 1987 to Degenkolb et al.

Consideration of the results of the above processes indicates that there is a need for a method of etching polyimides which provides critical dimension control and provides for an optical endpoint capability.

SUMMARY OF THE INVENTION

A method of manufacturing an integrated circuit deposits a layer of an organic polymer on a substrate and forms a layer of resist on the surface of the organic polymer. The organic polymer is an anti-reflection coating. Selected portions of the resist are exposed to radiation and portions of the resist are selectively removed to expose selected portions of the organic polymer which are etched with a plasma comprising $CHF_3$, a sputter component, and $O_2$. The $CHF_3$ promotes polymer formation which inhibits etching while the sputter component removes the polymer. In an exemplary embodiment, the organic polymer comprises a polyimide. In a preferred embodiment, the $CHF_3$ and the sputter component have flow rates into the etching apparatus such that the rates of polymer formation and polymer removal by sputtering are approximately balanced. In another preferred embodiment, the sputter component comprises Ar.

BRIEF DESCRIPTION OF THE DRAWING

The FIGURE is a sectional view of a portion of an integrated circuit and is useful in explaining this invention.

DETAILED DESCRIPTION

Figure 1:
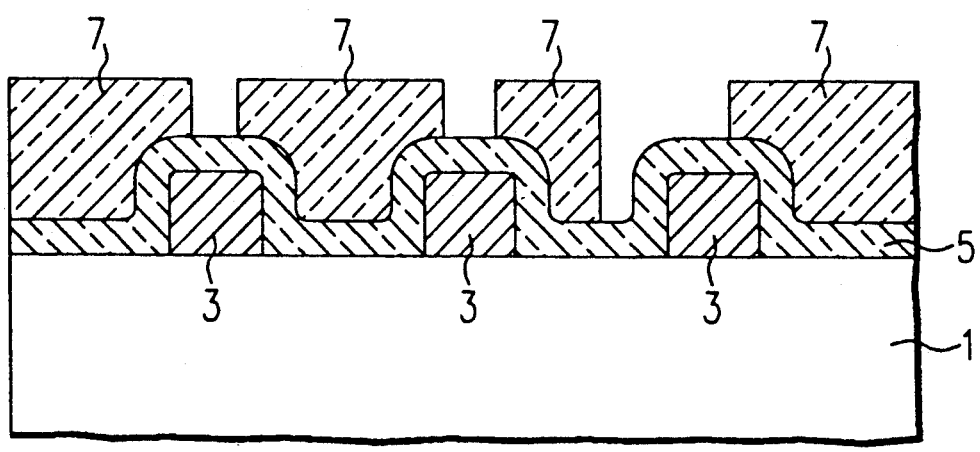

The invention will be explained by reference to the FIGURE and a particular embodiment. For reasons of clarity, the elements depicted are not drawn to scale.

Depicted in the FIGURE are substrate 1 and features 3 on substrate 1, polyimide layer 5, and resist layer 7. As can be seen, the polyimide layer covers the features 3 and the substrate surface. The resist has been patterned to expose selected portions of the polyimide layer. Selected portions of the resist are exposed to radiation which creates different removal rates when the resist is subsequently exposed to a removal agent, such as a plasma having the composition which will be discussed. The organic polymer serves as an anti-reflection coating for the radiation. The term *substrate* is used to mean any material that lies underneath and supports another material. The substrate may be single crystal silicon, with or without an epitaxial layer, or it may be a metal or dielectric layer. The features may be any of the device features present in integrated circuit devices or electrical interconnections which may be on any level. The term *polyimide* is well known to those skilled in the art and represents a well-defined class of organic polymers. No further description is required.

The structure depicted will be readily fabricated by those skilled in the art. The device features are well known as will be readily fabricated. An appropriate polyimide will also be readily selected and put on the substrate. An adhesion promoter may be used, if desired. The polyimide functions, as mentioned, as an anti-reflection coating for the radiation used in the pattern delineation process. The thickness of this layer is a function of the wavelength of the radiation used in the lithographic process and of the optical properties, i.e., reflectivity of the substrate. Those skilled in the art will readily select an appropriate thickness. The resist will be formed and usually patterned using techniques that can define features having dimensions less than 0.5 $\mu$m. It is contemplated that patterning of features smaller than 0.5 $\mu$m will use deep ultra-violet radiation. Such techniques are known to those skilled in the art.

The polyimide layer is etched after the overlying resist has been patterned to expose selected portions of the polyimide. The etch apparatus used is conventional, but the plasma used comprises $CHF_3/Ar/O_2$. The $CHF_3$ promotes polymer formation on the exposed surfaces while the Ar acts as a sputter component which removes the polymer formed by the $CHF_3$. The sputter component travels primarily in a vertical direction so that polymeric material on the sidewalls is not removed. The concentrations of $CHF_3$ and Ar in the plasma should be such that the rates of polymer formation and polymer removal by sputtering are approximately equal. Although precise concentrations in the plasma have not been measured, it has been found that the $CHF_3$ concentration should be between 10 and 35 percent of the total flow. Control of feature size is excellent for $CHF_3$ concentrations within this range.

The $CHF_3$ is also a desirable component of the plasma because it provides a convenient means for using optical endpoint detection. The F content of the plasma is monitored using well known techniques. When etching of the polyimide is finished, the F content of the plasma rises and etching can be terminated. Thus, etching is terminated when the F concentration reaches a predetermined level. The plasma also has good selectivity between the polyimide and the resist; in fact, selectivity of 1:1 has been obtained. Higher selectivities can be obtained but typically at the expense of slower polyimide etch rates.

Although the invention has been described by reference to a particular embodiment, variations will be evident to those skilled in the art. For example, the sputter component may be an inert gas other than Ar. Additionally, organic polymers other than polyimides may be used as the anti-reflection coating.

I claim:

1. A method of manufacturing an integrated circuit comprising the steps of:
    depositing a layer of an organic polymer on a substrate, said polymer being an anti-reflection coating;
    forming a layer of resist over the surface of said organic polymer;
    exposing selected portions of said resist to radiation and removing portions of said resist to expose selected portions of said organic polymer; and
    etching said selected portions of said organic polymer in a plasma comprising $CHF_3$, $O_2$ and a sputter component, said sputter component having a removal rate, to expose portions of said substrate.

2. A method as recited in claim 1 in which said organic polymer is selected from the group consisting of polyimides.

3. A method as recited in claim 2 in which $CHF_3$ has a polymer formation rate which is approximately equal to the sputter component removal rate.

4. A method as recited in claim 1 in which said sputter component comprises Ar.

5. A method as recited in claim 1 in which said $CHF_3$ forms between 10 and 35 percent of the total flow rate.

6. A method as recited in claim 1 comprising the further steps of:
    monitoring the F concentration in said plasma; and
    terminating etching when said concentration reaches a predetermined level.

* * * * *